(12) United States Patent
Sweet

(10) Patent No.: US 7,143,323 B2
(45) Date of Patent: Nov. 28, 2006

(54) HIGH SPEED CAPTURE AND AVERAGING OF SERIAL DATA BY ASYNCHRONOUS PERIODIC SAMPLING

(75) Inventor: Charles M. Sweet, Newtonville, MA (US)

(73) Assignee: Teradyne, Inc., Boston, MA (US)

( * ) Notice: Subject to any disclaimer, the term of this patent is extended or adjusted under 35 U.S.C. 154(b) by 667 days.

(21) Appl. No.: 10/319,116

(22) Filed: Dec. 13, 2002

(65) Prior Publication Data

US 2004/0117692 A1 Jun. 17, 2004

(51) Int. Cl.
*G01R 31/28* (2006.01)
*G06F 11/00* (2006.01)

(52) U.S. Cl. ..................... 714/724; 714/746
(58) Field of Classification Search ............... 714/723, 714/724, 745; 324/73.1; 326/16
See application file for complete search history.

(56) References Cited

U.S. PATENT DOCUMENTS

| 4,354,177 | A  |   | 10/1982 | Sloane ............... 340/347 |
| 5,696,773 | A  | * | 12/1997 | Miller ............... 714/745 |
| 6,243,841 | B1 | * | 6/2001  | Mydill ............... 714/724 |
| 6,275,962 | B1 | * | 8/2001  | Fuller et al. ....... 714/724 |
| 6,331,999 | B1 | * | 12/2001 | Ducaroir et al. .... 375/226 |
| 6,536,005 | B1 | * | 3/2003  | Augarten ............ 714/723 |
| 6,694,462 | B1 | * | 2/2004  | Reiss et al. ........ 714/724 |
| 6,859,902 | B1 | * | 2/2005  | Dalal et al. ........ 714/726 |

FOREIGN PATENT DOCUMENTS

| EP | 0518116 | 12/1992 |
| WO | WO 99/51941 | 10/1999 |

OTHER PUBLICATIONS

Cai et al, Digital serial communication device testing and its implications on automatic test equipment architecture, 2000, IEEE, pp. 600-609.*
Alan J. Reiss, Edge Find 1999, Apr. 12, 1999, Teradyne, Inc.
Time Jitter Digitizer, Version 6.4, Jun. 1999, Teradyne, Inc.
"Statistical Analysis with Messy Data" Gordon B. Saksena, Teradyne, Inc., Mar. 28, 2000.
"Optimizing Edgefinds" Gordon B. Saksena, Teradyne, Inc., 1998.

* cited by examiner

*Primary Examiner*—Shelly Chase
(74) *Attorney, Agent, or Firm*—David J. Rikkers; Foley & Lardner LLP

(57) ABSTRACT

An apparatus and process for measuring, testing, and/or characterizing high-speed bit streams includes repeating a serial bit steam and repetitively undersampling the repeated bit stream at a plurality of timing locations. Samples for each timing location are separately accumulated, and accumulated values are examined to determine the probability of the bit stream being high or low at each timing location. Identification of a periodic bit stream as well as measurement of jitter and other timing characteristics can then be measured.

21 Claims, 4 Drawing Sheets

$$N * (P_{REP} + R) = K * P_{REP}$$

HIGH SPEED CAPTURE AND AVERAGING OF SERIAL DATA BY ASYNCHRONOUS PERIODIC SAMPLING

CROSS-REFERENCES TO RELATED APPLICATIONS

Not Applicable.

Statement Regarding Federally Sponsored Research or Development

Not Applicable.

Reference to Microfiche Appendix

Not Applicable

BACKGROUND OF THE INVENTION

1. Field of the Invention

This invention relates generally to automatic test equipment (ATE) and accompanying processes for testing electronic devices, and, more particularly, to test equipment and processes for testing characteristics of high-speed bit streams.

2. Description of Related Art

Manufacturers of integrated circuits commonly use automatic test equipment (ATE) to verify devices at different manufacturing stages. Through the use of ATE, manufacturers can identify device faults early in the manufacturing process, thus avoiding the costs of performing additional manufacturing steps on defective devices. Manufacturers may also use ATE to grade devices across different levels of performance. As better-performing devices generally fetch higher prices, the ability accurately to test integrated circuits translates directly into increased profits.

A primary goal of ATE is to test electronic devices quickly and accurately. As devices become faster and more complex, ATE must advance to keep pace with these improvements.

The popularity of Serializer/Deserializer, or "SerDes," and other high-speed serial devices has greatly increased in recent years with improvements in telecommunications and networking technologies. SerDes devices convert parallel bit streams into serial bit streams that change at a multiple of the input, parallel data rate. They may also perform the reverse function of deserializing serial bit streams, by converting them into parallel bit streams that change at a fraction of the serial data rate. SerDes devices are now available at serial data rates up to 13 GB/s (billion bits per second), and 40 GB/s parts will soon be available. By comparison, state-of-the-art testers can commonly generate digital waveforms at speeds of only several hundred megahertz. This still falls short of the speed needed to directly test the fastest currently available SerDes devices at full speed.

Previous attempts at measuring high-speed serial bit streams have included using specialized test instruments such as TJD's (Time Jitter Digitizers). TJD's detect edges of electrical signals at their inputs and apply time-stamp values indicative of the times at which the edges occur. TJD's tend to be costly, multifunctional instruments, however, offering features that extend well beyond those needed for serial testing. They also tend to operate at slower speeds than those required for testing the fastest SerDes devices.

Another prior technique for testing serial bit streams is disclosed in U.S. patent application Ser. No. 09/635,334, entitled "CAPTURING AND EVALUATING HIGH SPEED DATA STREAMS," which is hereby incorporated by reference in its entirety. As described in that patent, a tester employs its digital driver circuits to apply parallel input data to a SerDes device, and employs a latching comparator to undersample the output of the SerDes device. The tester's detector circuits then sample the comparator's latched output to reconstruct the high-speed serial waveform. This technique is highly effective for measuring timing characteristics of serial bit streams. The technique tends to be exceedingly complex, however, both in terms of the programming instructions required to conduct the process and the computations needed to generate the measurement results.

What is desired is a simpler technique for measuring the timing characteristics of high-speed bit streams using automatic test systems.

BRIEF SUMMARY OF THE INVENTION

With the foregoing background in mind, it is an object of the invention to measure characteristics of high-speed bit streams.

To achieve the foregoing object, as well as other objectives and advantages, a technique for measuring bit streams includes repetitively driving the input of a high speed comparator with a bit stream and sampling the output of the comparator in response to a clock signal. The clock signal is made to assert at various timing locations within the bit stream, and the output of the comparator is directed to a series of accumulators. Each accumulator is made to sum the values for a single such timing location over the course of multiple repetitions of the bit stream.

According to one variation, values stored in the accumulators are used to represent probabilities that the bit stream is a one or a zero at each timing location. A probability function of the bit stream or portions thereof can be rendered, and characteristics of the bit stream can be extracted.

BRIEF DESCRIPTION OF THE DRAWINGS

Additional objects, advantages, and novel features of the invention will become apparent from a consideration of the ensuing description and drawings, in which—

DETAILED DESCRIPTION OF THE PREFERRED EMBODIMENT

Figure 1:
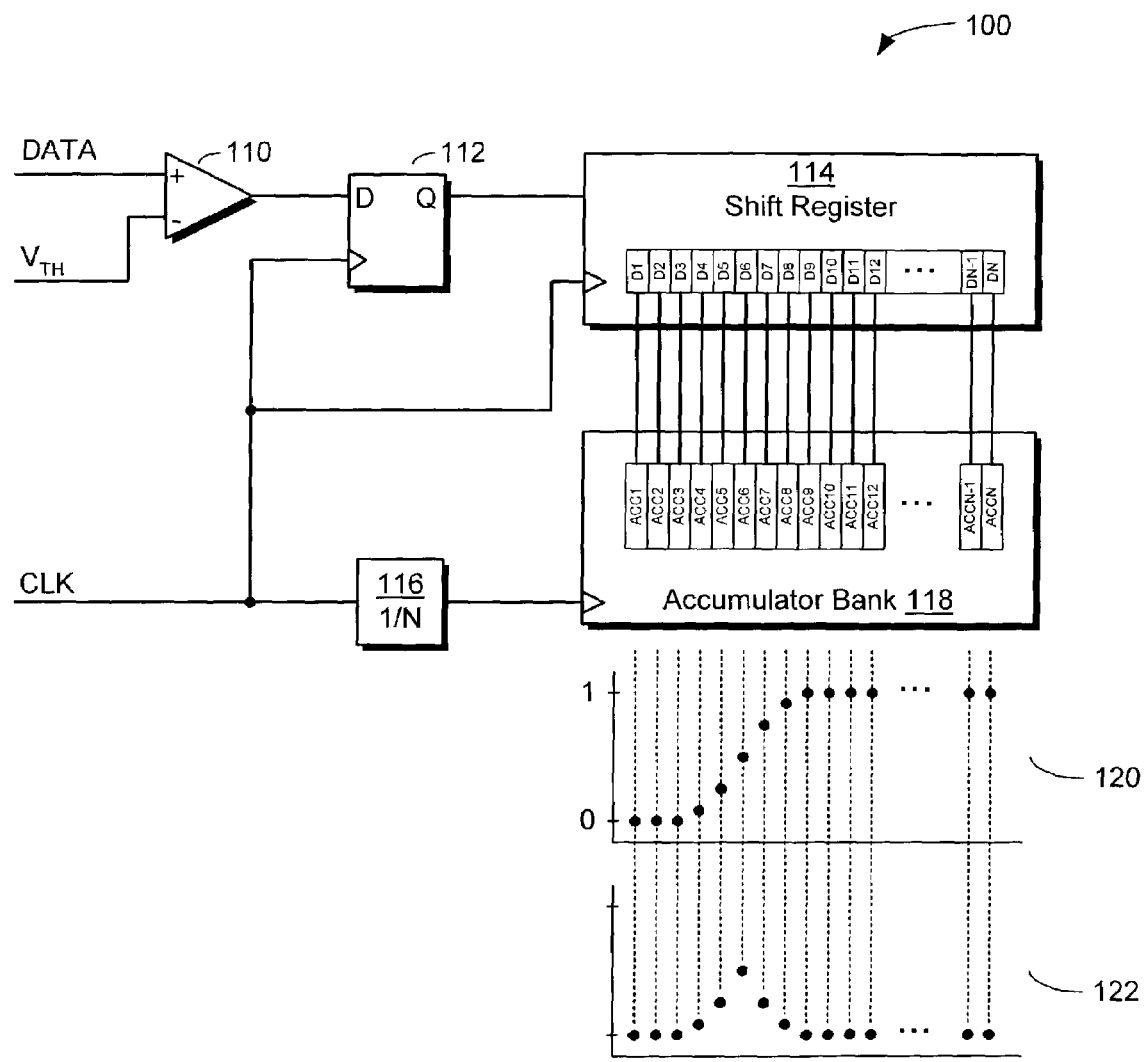
FIG. 1 is a simplified schematic of an embodiment of a circuit for undersampling serial bit streams in accordance with the invention.

FIG. 1 shows an exemplary embodiment of a circuit 100 for measuring serial bit streams according to the invention. A repeating serial bit stream "DATA" drives an input of a comparator 110. The comparator 110 compares DATA with a threshold voltage to produce a discrete-voltage representation of DATA. This discrete signal drives the input of a sampling circuit 112, such as a D flip-flop, which latches upon the assertion of a clock signal CLK. The output of the sampling circuit 112 thus represents the value of the discrete-voltage representation of DATA at the instant that CLK was most recently asserted.

The output of the sampling circuit 112 is directed to a bank of accumulators 118. In the preferred embodiment, an N-bit shift register 114 distributes the samples among N different accumulators. Upon each assertion of CLK, another bit of DATA is clocked into the shift register 114, and the previously stored bits are shifted to the right. When the shift register 114 is full (i.e., after N clock cycles), its contents are transferred in parallel to the bank of accumulators 118, where they are bitwise added to the contents of the accumulators. The shift register 114 is again loaded on subsequent clock cycles, and its contents are again transferred and bitwise added to the accumulators 118 after every N clock cycles.

The accumulators 118 preferably compute running sums of the samples applied to their inputs. For example, if the accumulator $ACC_1$ receives values of 1, 1, and 0 after 3N samples, the value of $ACC_1$ will be the sum of these values, or 2.

Owing to the relative timing of DATA and CLK, each accumulator is made to receive multiple samples from one and only one timing location within DATA. A "timing location" is a point along a serial bit stream, e.g., one that falls a fixed location with respect to the serial bit stream, such as a fixed delay from the start of the serial bit stream.

Figure 2:
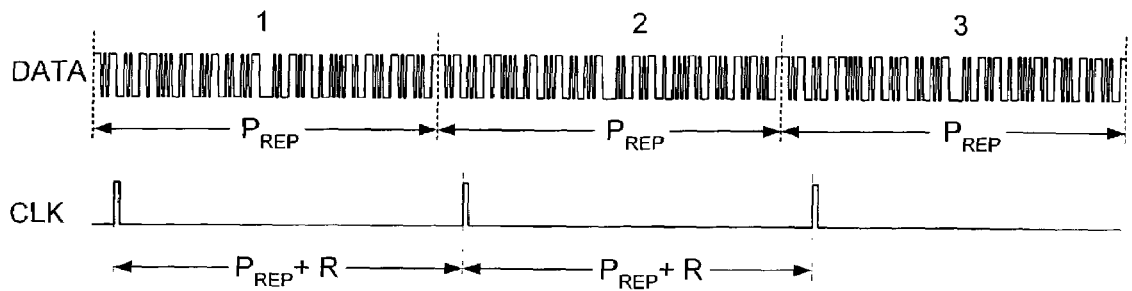
FIG. 2 is a timing diagram showing the relationship between signals used by the circuit of FIG. 1.

FIG. 2 shows the relative timing of DATA and CLK that enable effective undersampling of the serial bit stream. The serial bit stream shown in FIG. 2 is repeated at a rate of $1/P_{REP}$, while CLK is repeated at a rate of $1/(P_{REP}+R)$. R is the timing resolution, or the effective time difference between "adjacent" samples of the serial bit stream. It can therefore be seen that CLK effectively "walks" though the serial bit stream, acquiring consecutive samples that are R seconds apart on successive iterations of the serial bit stream. Through the operation of the shift register 114 or other distributing device, each sample is stored in a different accumulator until a complete pass is made though the serial bit stream.

The role of the accumulators is to obtain multiple samples at a plurality of timing locations within the serial bit stream. The samples received by each accumulator are summed or averaged to determine the relative probability of the serial bit stream being a one or a zero at each point. To ensure that the same timing locations are undersampled after every N passes through the serial bit stream, CLK must be made effectively to retrace its previous timing. This can be accomplished by setting the frequency of CLK and the repetition rate of DATA to satisfy the following equation:

$$N*(P_{REP}+R)=K*P_{REP}, \text{ where K is an integer.} \quad (EQ. 1)$$

This relationship is preferably maintained by deriving the frequencies for CLK and DATA from a common timing source.

Figure 3:
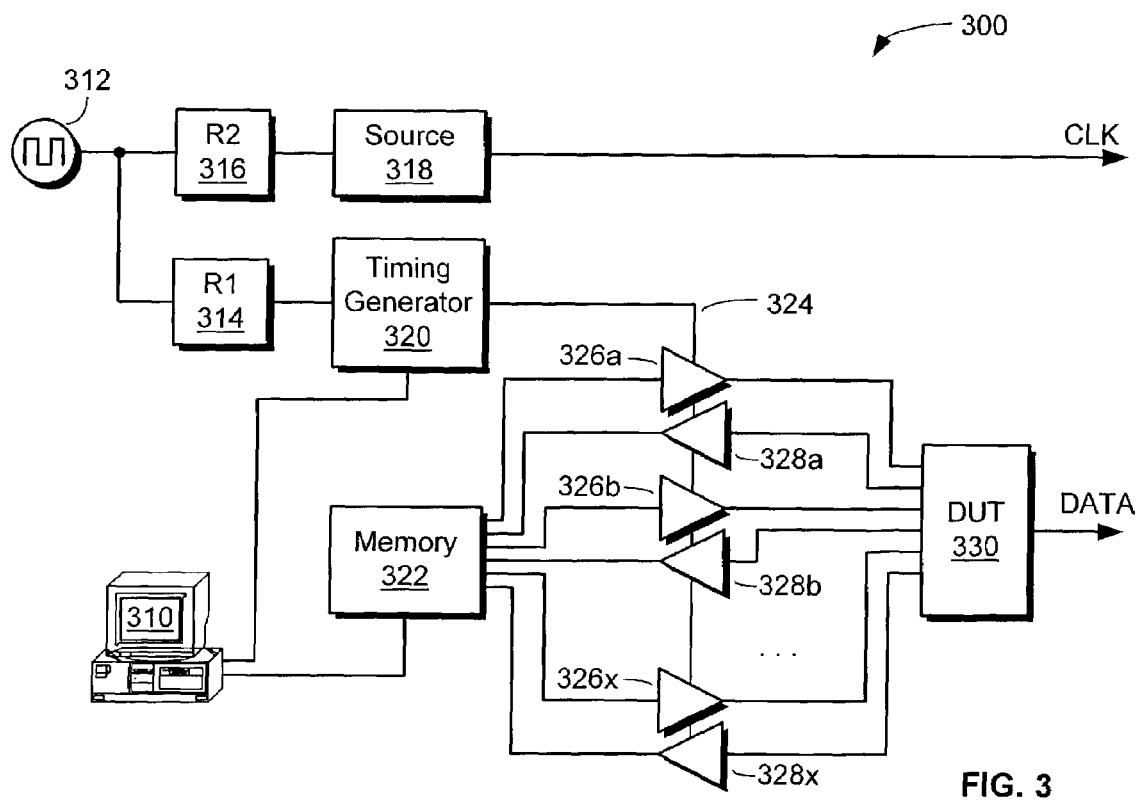
FIG. 3 is simplified schematic of a test system in which the circuit of FIG. 1 can be used.

FIG. 3 shows a simplified block diagram of an automatic test system 300 suitable for generating CLK and DATA and for testing serial bit streams according to the invention. The test system 300 includes a host computer 310 for running test programs for testing devices such as a SerDes device under test, or "DUT" 330. A system clock 312 generates a stable, high-frequency clock signal that can be multiplied and/or divided by programmable ratios to produce synchronized clocks at different frequencies. These clocks can then be distributed to different instruments for testing devices.

The test system 300 can stimulate the DUT to generate an appropriate DATA signal. Digital driver circuits 326a–326x provide parallel input signals to the DUT based on patterns stored in a memory 322. These patterns may include test patterns specifically designed for evaluating SerDes devices. A pattern generator 320 controls the timing of the driver circuits, in response to the system clock 312 and a first timing ratio 314. For SerDes ports, the serial data rate is generally M times the parallel data rate, where M is the number of bits in the port's parallel input signal. Thus, by outputting test vectors to the DUT at rate R, the data rate of the serial bit stream will be M*R.

A second source 318 preferably generates CLK from the system clock via a second ratio 316. To minimize jitter, the source 318 is preferably a digital source with very low jitter and fast edges. However, a digital source is not strictly required. The second source 318 can be a separate instrument (as shown), or it can be another driver circuit 326 (provided that the test system supports different clock frequencies for different driver circuits).

Because DATA and CLK are derived from the same system clock, their synchronization is ensured. In addition, the frequency ratio required by EQ. 1 above can be precisely established.

The contents of the accumulators 118 can be examined to determine various characteristics of the serial bit stream. In particular, the average value indicated by each accumulator (i.e., sum of samples divided by number of samples) gives the probability that the serial bit stream is a logic 1 at each timing location. These probabilities are useful in characterizing timing jitter of the serial bit stream. In addition, the values stored in the accumulators 118 indicate the level of DATA at each timing location. These levels can be examined to determine whether any bits have been dropped from the serial bit stream.

Referring back to FIG. 1, points 120 represent average values acquired from the accumulators $ACC_1$–$ACC_N$. Some of these values are 0 and some are 1. This constancy reflects the fact that the serial bit stream is always 0 or always 1 at the corresponding timing locations. Some averages, however, fall between 0 and 1, indicating that the bit stream is sometimes 0 and sometimes 1 at the corresponding timing locations. This variation is caused in large part by timing jitter in edges of the serial bit stream. To illustrate, consider a rising edge that nominally occurs at timing location T. If the edge occurs slightly earlier than T, a high level is sampled. If the edge occurs slightly later than T, a low level is sampled. If the edge occurs exactly at time T, a high level will be sampled half of the time and a low level will be sampled the other half of the time (probability will be 50%). Thus, we can say that the points 120 describe a "probability function" of the serial bit stream.

Points 122 describe a statistical distribution of the points from the probability function. The peak of this distribution represents the average or nominal location of an edge within the serial bit stream, and the standard deviation indicates the RMS jitter.

Test programs running on automatic test systems can read back data from the accumulators 118 and analyze the results. The test systems may read back all data from the accumulators 118, or may read back portions of the data related to particular edges. The tester may employ software for locating edges in the serial bit stream by searching through the probability function. The searching can be conducted linearly, binarily, or by other means. Test programs can test the probability functions to verify the correct edge locations or to verify that jitter is within allowable limits.

The comparator 110 allows the tester to generate probability functions for different threshold voltages. By varying the threshold $V_{TH}$, the tester can produce probability functions throughout the entire voltage range of DATA. This functionality allows a tester to measure rise times, fall times, and pulse widths of edges or portions of a serial bit stream, as well as to accommodate input signals having different voltage swings.

Preferably, the shift register 114 is very large, for example, 1000 bits or more, to accommodate large records of input data. For improved flexibility, shorter records may be acquired by varying the value of the divider 116, which effectively varies the value of N.

The comparator 110 and flip-flop 112, which operate at high speed, are preferably implemented using a high-speed semiconductor process such as SiGe, either with commercially available parts or with an Application Specific Integrated Circuit (ASIC). The shift register 114, divider 116, and the bank of accumulators 118 can operate at slower speeds and are preferably implemented using a Field Programmable Gate Array (FPGA).

Figure 4:
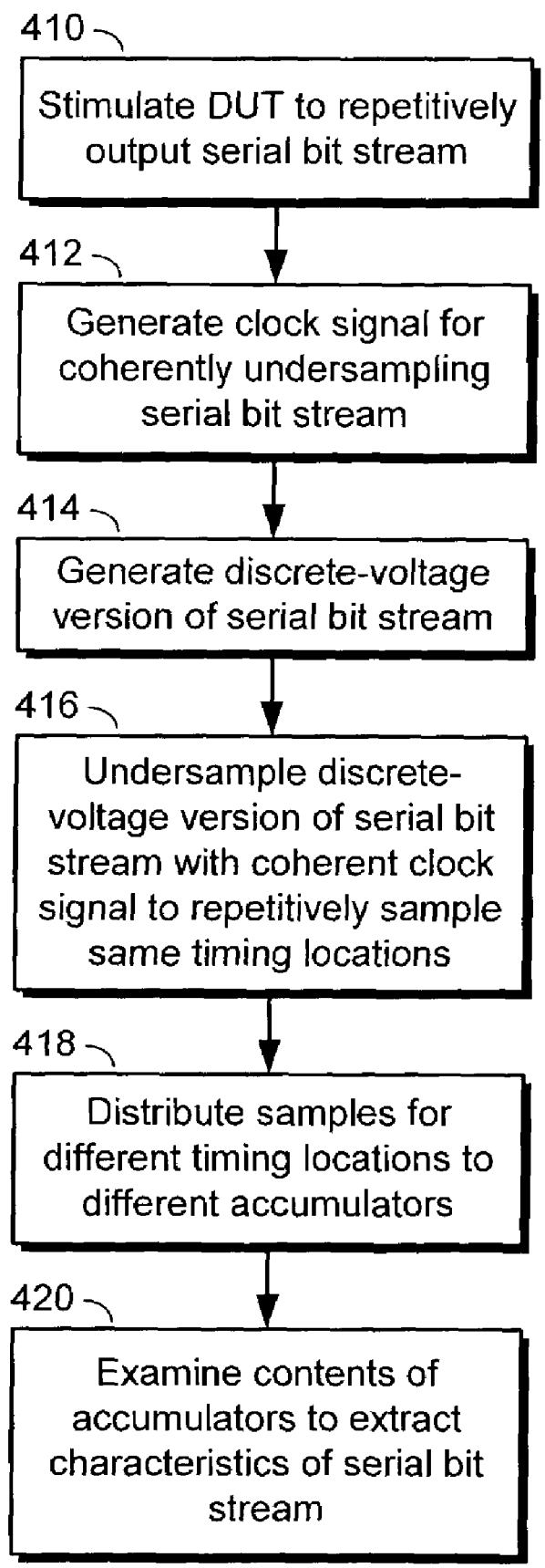
FIG. 4 is a flowchart showing a process for measuring serial bit streams according to the invention.

FIG. 4 shows a flowchart that summarizes and reviews the process described above for measuring serial bit streams. At step 410, the tester stimulates the DUT 330 to repetitively output the serial bit stream DATA. At step 412, the tester generates a clock signal (CLK) for coherently undersampling the serial bit stream, i.e., for sampling it so that CLK effectively retraces its timing on successive passes through the bit stream. At step 414, the comparator 110 generates a discrete-voltage version of the serial bit stream by comparing it with a threshold voltage. The serial bit stream is undersampled at step 416 to repetitively sample the timing locations. At step 418, the samples for the different timing locations are distributed to different accumulators. The accumulators sum the samples they receive and allow an average value or probability to be produced for each timing location. The resulting probability function, or portions thereof, may then be examined to extract characteristics from the serial bit stream.

Alternatives

Figure 5:
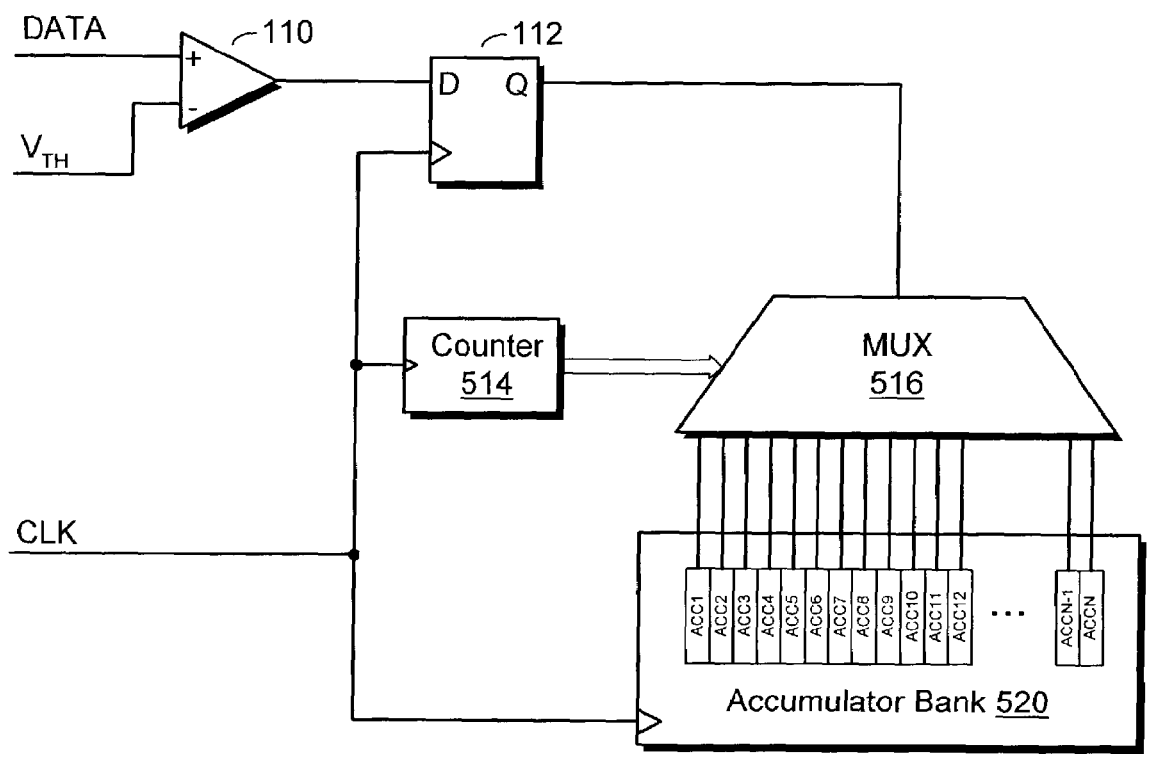
FIG. 5 is a simplified schematic of an alternative embodiment of an undersampling circuit in accordance with the invention.

Having described one embodiment, numerous alternative embodiments or variations can be made. For example, as described above, a shift register 114 is used to distribute samples of the serial bit stream to different accumulators. Other types of distributing devices could be used, however. One alternative is shown in FIG. 5. There, the output of the sampler 112 is fed to a multiplexor 416. A counter 414 increments selector bits of the multiplexor in response to CLK, to send the output of the sampler 112 to a different accumulator on each cycle of CLK.

As shown and described herein, a comparator 110 is used for converting DATA into a discrete-voltage signal. The comparator is not strictly required, however. In many cases, DATA will already be a discrete-voltage signal having voltage levels that are compatible with the sampler 112. In addition, not all applications require examining edges at different voltage levels. Thus, the ability to compare DATA with different threshold voltages is not an essential part of the invention.

As shown and described, the sampler 112 is implemented as a D flip-flop. Other types of flip-flops or latching devices can be used, however. Because the shift register 114 is clocked, the shift register (or other distributing device) may itself be used for latching DATA, assuming the shift register's requirements for setup and hold time can be satisfied. If the distributing device is transparent, as in the case of some multiplexor circuits, the accumulators 118 could also be used for latching DATA.

As described herein, the circuit 100 for measuring serial bit streams acquires a new sample of DATA on every cycle of CLK. This is not required, however. Cycles of CLK can be skipped between adjacent samples. Skipping cycles may be desirable when CLK changes too quickly for the shift register or other circuitry to follow. When skipping cycles, the frequency of CLK should be divided prior to being applied to the shift register 114 and accumulators 118. For instance, if every a sample is taken every fourth cycle of CLK, CLK should be divided by four prior to being applied to these elements.

As shown and described, the period of CLK is slightly longer than the period at which the serial bit stream is repeated ($P_{REP}$). This causes CLK to "walk" forward in time through the serial bit stream. Alternatively, the period of CLK could be made slightly shorter than $P_{REP}$, which would cause CLK to walk backward in time. The order of samples could then be reversed, if desired, for subsequent processing. According to yet another variation, the period of CLK could be made slightly longer or shorter than any integer multiple of $P_{REP}$.

The accumulators 118 as described herein compute running sums of values applied to their inputs. Alternatively, the accumulators could be implemented as simple memories for storing a collection of samples, the values of which can later be summed or averaged using hardware and/or software to yield the desired probabilities.

The particular examples provided herein are shown with SerDes devices and/or ports. It should be understood, however, that the invention can also be applied to other types of serial devices and/or ports, including but not limited to SONET, Fast Ethernet, and high-speed multiplexors. The invention may further be applied to measuring individual data signals from parallel bit streams.

Although the examples provided herein are shown with respect to single-ended signals, it should be understood that the invention applies to both single-ended and differential signals. For differential signals, it is preferably to sample DATA using a differential comparator, e.g., one that compares the difference between its inputs with an adjustable threshold). Many such comparators are known to those skilled in the art. In addition, although the invention is shown with respect to binary logic (1's and 0's), the invention is not limited to binary logic and may be used with discrete logic having greater than two levels.

Therefore, while the invention has been particularly shown and described with reference to the preferred embodiments thereof, it will be understood by those skilled in the art that various changes in form and detail may be made therein without departing from the spirit and scope of the invention.

What is claimed is:

1. A method of measuring bit streams comprising:
   repetitively driving an input of a comparator with a bit stream;
   sampling an output of the comparator at a plurality of timing locations relative to the bit stream;
   directing the sampled output to a plurality of accumulators, wherein each of the plurality of accumulators receives samples for one and only one of the plurality of timing locations of the bit stream;
   augmenting values stored in the plurality of accumulators, responsive to sampled values; and examining the contents of different ones of the plurality of accumulators.

2. A method as recited in claim 1, wherein the step of sampling includes undersampling the output of the comparator.

3. A method as recited in claim 2, wherein the bit stream is repeated with a period $P_{REP}$ and the plurality of timing locations is defined by a clock having a period $P_{CLK}$ that is related to $P_{REP}$ by a fixed ratio.

4. A method as recited in claim 3, wherein $P_{CLK}=M*P_{REP}+R$, wherein M is an integer and 1/R is the effective sampling rate.

5. A method as recited in claim 1, wherein the step of directing the output of the comparator to a plurality of accumulators comprises directing the output of the comparator to a shift register.

6. A method as recited in claim 5, wherein the step of directing further comprises directing each bit of the shift register to a different one of the plurality of accumulators.

7. A method as recited in claim 1, wherein the step of sampling comprises acquiring a sequential range of samples representing contiguous timing locations along the bit stream.

8. A method as recited in claim 7, wherein the step of examining comprises linearly searching through the contents of the accumulators representing the sequential range of samples to locate at least one edge of the bit stream.

9. A method as recited in claim 7, wherein the step of examining comprises binarily searching though the contents of the accumulators representing the sequential range of samples to locate at least one edge of the bit stream.

10. A method as recited in claim 7, wherein the step of examining comprises translating at least some of the contents of the accumulators representing the sequential range of samples into probabilities indicative of whether the corresponding samples are high logic levels.

11. A method of testing a device under test (DUT) that generates a bit stream, comprising the steps of:
stimulating the DUT to repetitively generate a bit stream;
sampling the bit stream at a plurality of timing locations;
directing the sampled output to a plurality of memories, wherein each of the plurality of memories receives samples for a corresponding one of the plurality of timing locations;
augmenting values stored in the plurality of memories; and
examining values stored in different ones of the plurality of memories, to determine whether the DUT passes or fails a test.

12. A method of testing a device under test (DUT) that generates a bit stream, comprising the steps of:
stimulating the DUT to repetitively generate a bit stream;
sampling the bit stream at a plurality of timing locations;
directing the sampled output to a plurality of memories, wherein each of the plurality of memories receives samples for a corresponding one of the plurality of timing locations;
augmenting the values stored in the plurality of memories, responsive to sampled values, so that each of the plurality of memories reflects a sum of acquired samples at the respective timing location; and
examining values stored in different ones of the plurality of memories, to determine whether the DUT passes or fails a test.

13. A method of testing a device under test (DUT) that generates a bit stream, comprising the steps of:
stimulating the DUT to repetitively generate a bit stream;
sampling the bit stream at a plurality of timing locations;
directing the sampled output to a plurality of memories, wherein each of the plurality of memories receives samples for a corresponding one of the plurality of timing locations; and
examining values stored in different ones of the plurality of memories, to determine whether the DUT passes or fails a test,
wherein the bit stream is repeated with a period $P_{REP}$ and the plurality of timing locations is defined by a clock having a period $P_{CLK}$ that is related to the repetition rate by a fixed ratio.

14. A method as recited in claim 13, wherein $P_{CLK}=M*P_{REP}+R$, wherein M is an integer and 1/R is the effective sampling rate.

15. An apparatus for measuring high-speed bit streams, comprising:
a comparator having an input for receiving a bit stream and an output for generating a discrete-voltage representation of the bit stream;
a clock signal for defining a plurality of timing locations within the bit stream at which a plurality of samples of the discrete-voltage representation of the bit stream are to be taken;
a plurality of accumulators coupled to the output of the comparator for storing the plurality of samples; and
augmenting means for augmenting values stored in the plurality of accumulators.

16. The apparatus as recited in claim 15, wherein each of the plurality of accumulators is constructed and arranged for storing samples for a different one of the plurality of timing locations.

17. The apparatus as recited in claim 15, further comprising a shift register having a data input coupled to the output of the comparator and a clock input for receiving the clock signal.

18. An apparatus for measuring high-speed bit streams, comprising:
a comparator having an input for receiving a bit stream and an output for generating a discrete-voltage representation of the bit stream;
a clock signal for defining a plurality of timing locations within the bit stream at which a plurality of samples of the discrete-voltage representation of the bit stream are to be taken;
a plurality of accumulators coupled to the output of the comparator for storing the plurality of samples; and
a shift register having a data input coupled to the output of the comparator and a clock input for receiving the clock signal,
wherein the shift register comprises a different bit for each of the plurality of accumulators.

19. An apparatus for measuring high-speed bit streams, comprising:
a comparator having an input for receiving a bit stream and an output for generating a discrete-voltage representation of the bit stream;
a clock signal for defining a plurality of timing locations within the bit stream at which a plurality of samples of the discrete-voltage representation of the bit stream are to be taken;
a plurality of accumulators coupled to the output of the comparator for storing the plurality of samples;
a shift register having a data input coupled to the output of the comparator and a clock input for receiving the clock signal; and a data rate reduction circuit coupled in series between the output of the comparator and the data input of the shift register.

20. A testing apparatus for testing high-speed bit streams, comprising:
- a waveform source for generating a clock signal for defining a plurality of timing locations within a bit stream at which a plurality of samples of the bit stream are to be taken;
- a sampling circuit having an input for receiving the bit stream and an output for generating a plurality of discrete-voltage samples of the bit stream;
- a plurality of memory portions coupled to the output of the comparator for storing the plurality of discrete voltage samples, and
- augmenting means for augmenting values stored in the plurality of memory portions, wherein each of the plurality of memory portions stores an accumulated sum of samples for one of the plurality of timing locations.

21. A process for measuring bit streams, comprising:
- repeating a serial bit steam at a first rate;
- undersampling the repeated bit stream at a second rate that is slightly different from the first rate, the first and second rates being coherent such that a plurality of timing locations relative to the bit stream are repetitively sampled;
- separately accumulating samples of the bit stream for each of the plurality of timing locations;
- augmenting values of the accumulated samples; and
- examining the accumulated samples to determine the probability of the bit stream being high or low at each timing location.

* * * * *